US009530694B2

(12) United States Patent
Bae

(10) Patent No.: US 9,530,694 B2
(45) Date of Patent: Dec. 27, 2016

(54) METHOD FOR FABRICATING SEMICONDUCTOR DEVICE HAVING THROUGH SILICON VIA

(71) Applicant: SK hynix Inc., Icheon (KR)

(72) Inventor: Byung Wook Bae, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/755,252

(22) Filed: Jun. 30, 2015

(65) Prior Publication Data

US 2015/0303109 A1     Oct. 22, 2015

Related U.S. Application Data

(62) Division of application No. 14/159,344, filed on Jan. 20, 2014, now abandoned.

(30) Foreign Application Priority Data

May 6, 2013 (KR) .......................... 10-2013-0050829

(51) Int. Cl.
H01L 21/469      (2006.01)
H01L 21/4763     (2006.01)
H01L 21/44       (2006.01)
H01L 21/768      (2006.01)
H01L 23/48       (2006.01)
H01L 21/306      (2006.01)
H01L 21/3105     (2006.01)
H01L 21/311      (2006.01)

(52) U.S. Cl.
CPC ... *H01L 21/76898* (2013.01); *H01L 21/30604* (2013.01); *H01L 21/31053* (2013.01); *H01L 21/31111* (2013.01); *H01L 21/31144* (2013.01); *H01L 21/76831* (2013.01); *H01L 21/76843* (2013.01); *H01L 21/76877* (2013.01); *H01L 23/481* (2013.01); *H01L 2924/0002* (2013.01)

(58) Field of Classification Search
CPC ................... H01L 21/76898; H01L 21/31111; H01L 21/31053; H01L 21/30604; H01L 21/3114; H01L 21/76843; H01L 21/76831; H01L 21/76877; H01L 23/481; H01L 2924/0002; H01L 21/76841; H01L 21/76844; H01L 21/76846; H01L 21/76847; H01L 21/76849; H01L 21/76802; H01L 23/5226; H01L 23/5384
USPC ....... 438/629, 637, 639, 640, 667, 672, 675, 438/700
See application file for complete search history.

(56) References Cited

U.S. PATENT DOCUMENTS

2011/0133335 A1   6/2011  Chen
2011/0226730 A1   9/2011  Pratt
2012/0202109 A1   8/2012  Seo et al.
(Continued)

FOREIGN PATENT DOCUMENTS

KR    10-2012-0090828 A    8/2012

*Primary Examiner* — A. Sefer
*Assistant Examiner* — Dilinh Nguyen

(57) ABSTRACT

A semiconductor device includes a semiconductor substrate configured to include a circuit pattern at one surface, an insulation film formed over a back surface of the semiconductor substrate, a through silicon via (TSV) configured to pass through the semiconductor substrate and the insulation film, and an oxide film formed at a sidewall of the TSV and protruded from the back surface of the semiconductor substrate in a manner that the oxide film partially contacts the insulation film.

8 Claims, 7 Drawing Sheets

(56) References Cited

U.S. PATENT DOCUMENTS

2012/0248581 A1* 10/2012 Sugiyama ......... H01L 21/76898
   257/622
2013/0270712 A1* 10/2013 Chen ................. H01L 21/76898
   257/774

* cited by examiner

METHOD FOR FABRICATING SEMICONDUCTOR DEVICE HAVING THROUGH SILICON VIA

CROSS-REFERENCE TO RELATED APPLICATION

The present application is a divisional of U.S. Application No. 14/159,344 filed on Jan. 20, 2014, which claims priority of Korean patent application No. 10-2013-0050829 filed on 6 May 2013, the disclosures of which are hereby incorporated in their entirety.

BACKGROUND OF THE INVENTION

Embodiments relate to a semiconductor device and a method for fabricating the same, and more particularly, to a technology for preventing migration of a metallic material in a through silicon via (TSV) when forming the TSV.

Among packaging technologies of semiconductor integrated circuits (ICs), a three-dimensional (3D) stack technology has been rapidly developed to increase packaging density and reduce the size of electronic components, resulting in production of high-performance semiconductor devices. A 3D stacked package is formed by stacking a plurality of chips that have the same memory capacity, and is generally called a chip stack package.

A chip stack package can be mass produced at a reduced cost. However, in a stack chip package, as the number and size of stacked chips increase, a line space for electrical connection of the stacked chips may be reduced to an insufficient size.

A conventional stack chip package includes a plurality of chips mounted on substrates which are attached to each other. This configuration enables a bonding pad of each chip to be electrically coupled to a conductive circuit pattern formed in or over a substrate through wiring. However, since a space for wire bonding and a circuit pattern area for the substrate connected to the wire are needed, the size of the stack chip package increases.

In order to solve the above-mentioned problems, a TSV structure has been proposed. After forming a TSV in each chip in a wafer, physical and electrical connection between chips is vertically implemented by the TSV.

However, if the TSV is repetitively exposed to heat treatment during a fabrication process, then a metallic material (e.g., Cu ion) contained in the TSV may be stressed and gather in an active region of the semiconductor device. The accumulated metallic material may serve as a generation and recombination center of minority carriers, and thus a leakage current may occur. As a result, electrical characteristics of a package of semiconductor devices are deteriorated.

In addition, when forming a TSV configured to pass through a semiconductor substrate and an interlayer insulation film, Cu ions may migrate through oxide films before being absorbed in an active region of the semiconductor substrate of the cell region, thus causing a crack in a bit line contact deposited over the active region.

BRIEF SUMMARY OF THE INVENTION

Embodiments of the present invention are directed to providing a semiconductor device and a method for fabricating the same, which substantially obviate one or more problems due to limitations and disadvantages of the related art.

An embodiment of the present invention relates to a semiconductor device and a method for fabricating the same, which can prevent Cu migration contained in a through silicon via when forming the TSV.

In accordance with an aspect of the present invention, a semiconductor device includes: a semiconductor substrate including a circuit pattern formed at a front side of the semiconductor substrate; an insulation film formed over a back side of the semiconductor substrate; a through silicon via (TSV) passing through the semiconductor substrate and the insulation film; and an oxide film formed over a sidewall of the TSV and protruded from a back side of the semiconductor substrate to the insulation film so that the oxide film partially contacts the insulation film.

The oxide film may not be exposed to the outside of the insulation film. The semiconductor device may further include: a metal barrier film formed over the TSV. The semiconductor device may further include: a prevention film formed over the metal barrier film.

The insulation film and the prevention film may include a nitride film. The top surface of the oxide film protrudes from the back surface of the semiconductor substrate by a height of around 1 μm to around 1.5 μm.

The semiconductor device may includes: a semiconductor substrate including a circuit pattern formed at a front side of the semiconductor substrate; a mask film formed over a back side of the semiconductor substrate; a through silicon via (TSV) passing through the semiconductor substrate and the mask film, protruding from the mask film; and an oxide film formed over a sidewall of the TSV, protruded from a back side of the semiconductor substrate and formed not to extend beyond a top surface of the mask film provided over the semiconductor substrate.

The oxide film may be formed of a photoresist or carbon material. The mask film may be formed to have a thickness of around 3 μm to around 3.5 μm.

In accordance with another aspect of the present invention, a method for forming a semiconductor device includes: forming a through silicon via (TSV) passing through a semiconductor substrate that includes a circuit pattern formed at a front side of the semiconductor substrate; forming an oxide film over a sidewall of the TSV; etching a portion of a back side of the semiconductor substrate; etching a portion of the oxide film so that the etched oxide film protrudes from the back surface of the etched semiconductor substrate; and forming an insulation film over the etched semiconductor substrate and the etched oxide film.

The forming the oxide film may include: forming a vertical hole in the semiconductor substrate; and forming the oxide film along a surface of the vertical hole, wherein the TSV is formed by filling the vertical hole in which the oxide film is formed, with a conductive material.

The method may further include: prior to filling the vertical hole with the conductive material, forming a prevention film along a surface of the oxide film; and forming a metal barrier film along a surface of the prevention film.

The etching some parts of the oxide film may include: exposing a top portion and an upper sidewall of the oxide film over the TSV by etching the portion of the back side of the semiconductor substrate; forming a mask film over the etched semiconductor substrate; etching the top portion and a part of the upper sidewall of the oxide film using the mask film as a mask; and removing the mask film so that a back surface of the etched semiconductor substrate is exposed and the etched oxide film protrudes from the back surface of the etched semiconductor substrate.

The forming the mask film may include: forming the mask film so that the TSV passes through the mask film and protrudes from a top surface of the mask film.

The removing the top portion and the upper sidewall of the oxide film includes: removing the top portion and the upper sidewall of the oxide film so that the etched oxide film protrudes from the back surface of the etched semiconductor substrate and includes a top surface disposed under a top surface of the mask film.

The forming the insulation film over the back surface of the etched semiconductor substrate includes: depositing an insulation material over the back surface of the etched semiconductor substrate, the etched oxide film, and the TSV; and planarizing the deposited insulation material until a top surface of the TSV is exposed to form the insulation film.

The mask film may be formed of a photoresist or carbon material. The insulation film and the prevention film may include a nitride film.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

A semiconductor device and a method for fabricating the same according to embodiments of the present invention will be described with reference to FIGS. 1 to 3.

Figure 1:
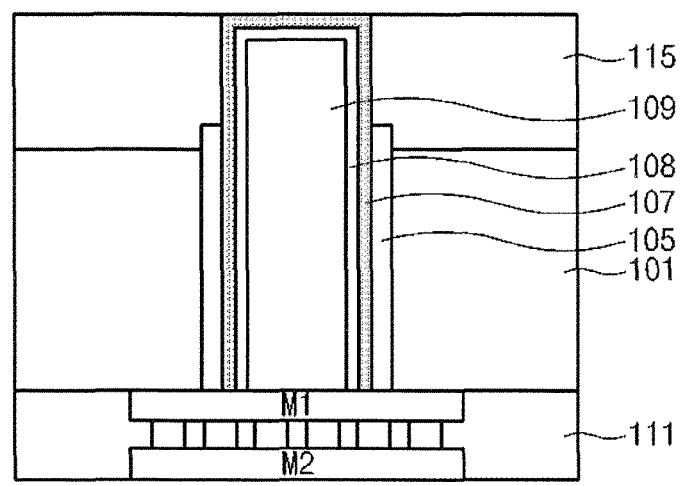
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, the semiconductor device includes a TSV 109 formed to pass through a semiconductor substrate 101 and an insulation film 115, a metal barrier film 108 formed to enclose the TSV 109, a prevention film 107 formed to enclose the metal barrier film 108, an oxide film 105 formed on a sidewall of the prevention film 107, and an interlayer insulation film 111. The interlayer insulation film 111 is formed over the frond side of the semiconductor substrate 101 and includes metal lines M1 and M2 formed therein. The oxide film 105 protrudes from a back surface of the semiconductor substrate 101. That is, a top surface of the oxide film 105 is disposed at a higher position than the back surface of the semiconductor substrate 101.

An upper portion of the TSV 109 protrudes from the back surface of the semiconductor substrate 101 as a result of a process of grinding the back side of the semiconductor substrate 101, which is performed after the oxide film 105 formed on the sidewall of the prevention film 107 is partially etched. Since the upper portion of the TSV 109 protrudes, the semiconductor device can prevent copper (Cu) of the TSV 109 from migrating through the oxide film 105.

Since the top surface of the oxide film 105 is formed to protrude from the back surface of the semiconductor substrate 101, formation of a crack in the oxide film 105 in the vicinity of the semiconductor substrate 101 can be prevented even if a void is formed in an area near the interface between the semiconductor substrate 101 and the insulation film 115 when forming the insulation film 115 over the semiconductor substrate 101.

FIGS. 2A to 2J are cross-sectional views illustrating a method for fabricating a semiconductor device according to an embodiment of the present invention.

Figure 2A:
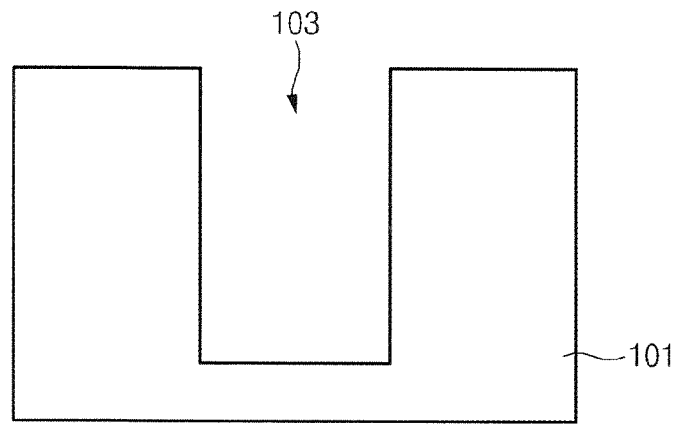
FIGS. 2A to 2J are cross-sectional views illustrating a method for fabricating a semiconductor device according to an embodiment of the present invention.
Figure 3:
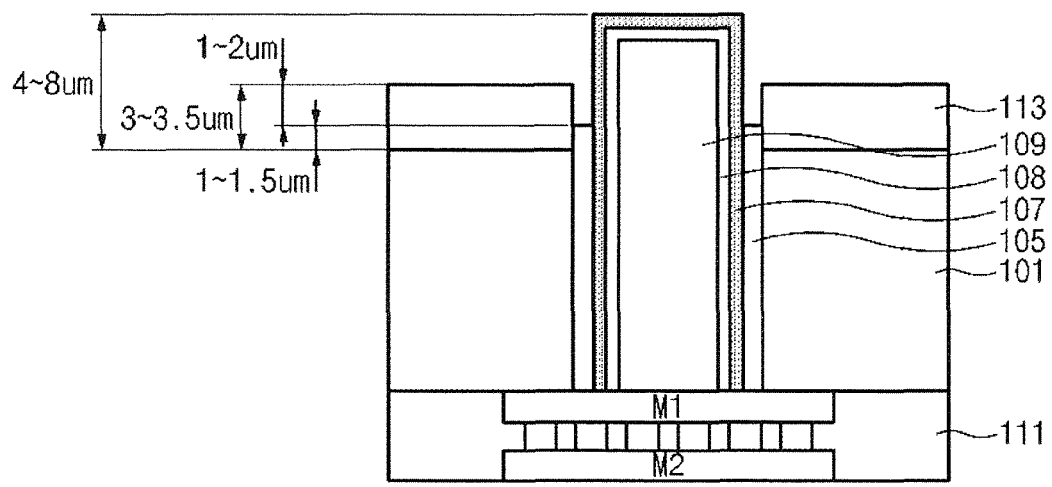
FIG. 3 is a cross-sectional view illustrating a detailed configuration of an oxide film and a semiconductor substrate according to an embodiment of the present invention.

Referring to FIG. 2A, a semiconductor substrate 101, which includes a circuit pattern, e.g., a transistor (not shown), formed at its front side, is etched to form a vertical hole 103 therein.

Figure 2B:
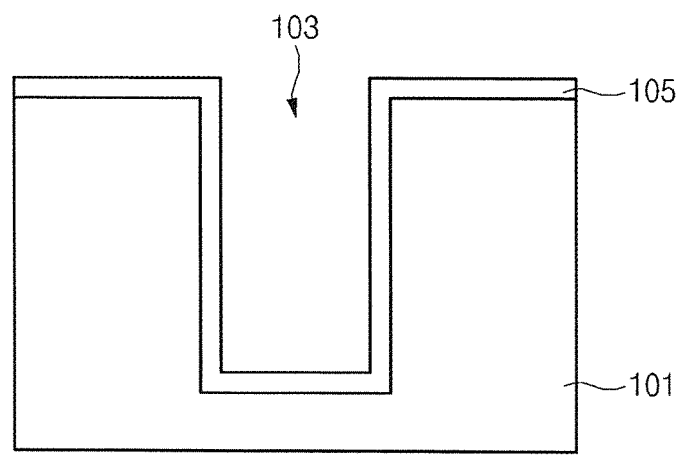

Subsequently, as shown in FIG. 2B, an oxide film 105 having a predetermined thickness is formed along a surface of the vertical hole 103 on a sidewall and bottom of the etched semiconductor substrate 101.

Figure 2C:
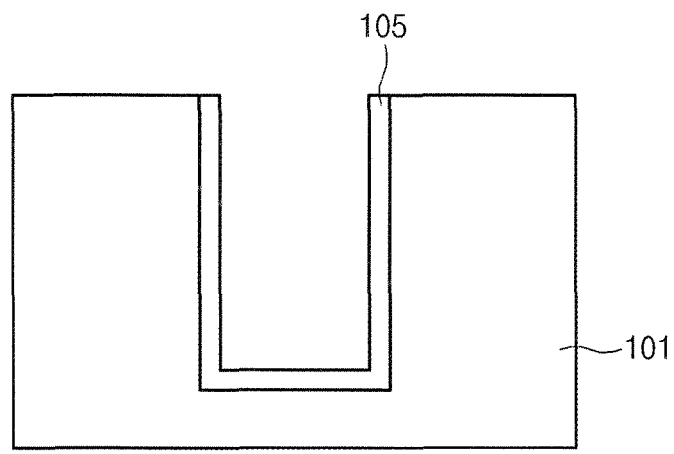

After that, as shown in FIG. 2C, the oxide film 105 is planarized so that a top surface of the etched semiconductor substrate 101 is exposed and the oxide film 105 remains only in the vertical hole 103. The planarization may be performed by chemical mechanical polishing (CMP).

Figure 2D:
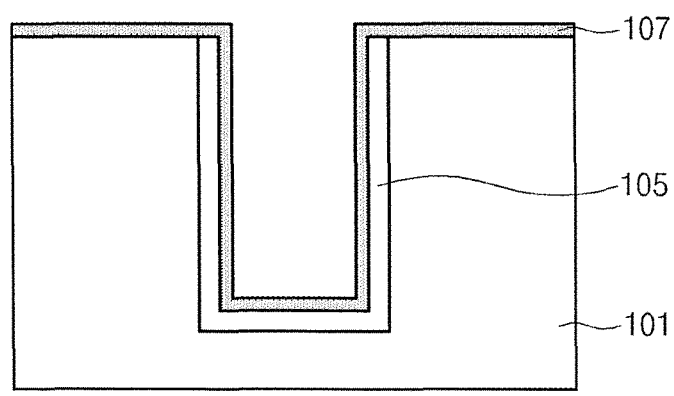

Referring to FIG. 2D, a prevention film 107 is deposited with a predetermined thickness not only over the oxide film 105 remaining in the vertical hole 103 but also over the exposed semiconductor substrate 101. In an embodiment, the prevention film 107 has lower etch selectivity than the oxide film 105, and may be formed of a nitride material or the like.

Figure 2E:
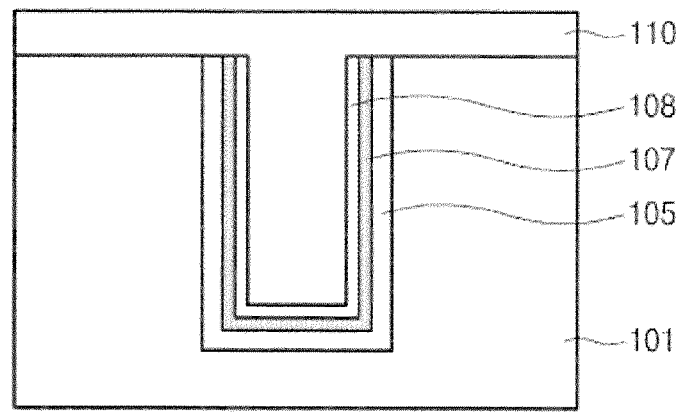

Referring to FIG. 2E, the prevention film 107 is planarized so that the top surface of the etched semiconductor substrate 101 is exposed and the prevention film 107 remains only in the vertical hole 103. Subsequently, a metal barrier film 108 is deposited with a predetermined thickness not only over the prevention film 107 but also over the exposed semiconductor substrate 101, and is then planarized so that the top surface of the etched semiconductor substrate 101 is exposed. In an embodiment the metal barrier film 108 may be a single film formed of tantalum (Ta), titanium (Ti), or the like. In another embodiment, the metal barrier film 108 may be stacked in a hybrid form of more than one layer using at least one metallic material.

For example, the metal barrier film 108 may include one of a stacked structure of Ta and tantalum nitride (TaN), a stacked structure of Ta, Ti and titanium nitride (TiN), a stacked structure of Ta and tungsten (W), a stacked structure of Ta and tungsten nitride (WN), or a combination thereof. The metal barrier film 108 may be formed to have a thickness of 1000 Å~5000 Å.

After that, a metal seed is deposited over a resultant structure including the metal barrier film 108, and then a conductive film 110 is formed using the metal seed over the resultant structure including the metal barrier film 108 so as to fill an inside of the vertical hole 103. In an embodiment, the metal seed includes copper (Cu). Deposition of the metal seed may be carried out using a sputtering method, and the conductive film 110 may be formed using an electroplating method. The conductive film 110 is annealed so that characteristics of the conductive film 110 are improved. The annealing may be performed at a temperature of about 100° C.

Figure 2F:
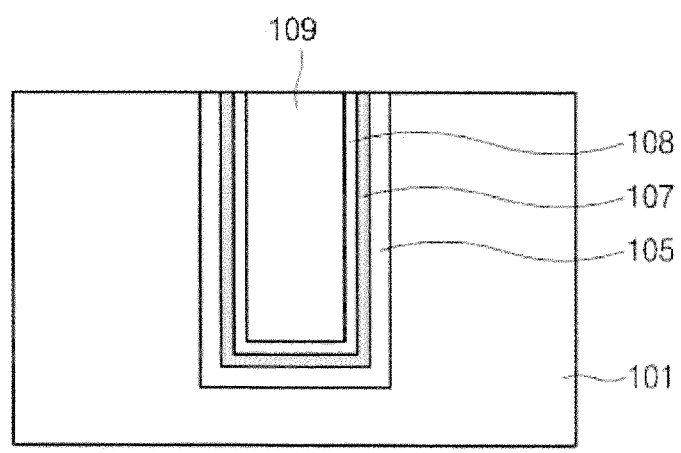

Referring to FIG. 2F, the conductive film 110 is planarized so that a TSV 109 passing through the semiconductor substrate 101 is formed.

It should be noted that the method for forming a trench, i.e., the vertical hole 103, in the semiconductor substrate 101 to form the TSV 109, shown in FIGS. 2A to 2F, is disclosed only for illustrative purposes, and thus the trench can be formed in various ways to form the TSV 109.

Subsequently, an interlayer insulation film 111 is deposited over the semiconductor substrate 101 including the TSV 109, and a photoresist film (not shown) is formed over the interlayer insulation film 111. After that, a photoresist pattern (not shown) is formed by performing an exposure and development process on the photoresist film using a metal line mask (not shown). The interlayer insulation film 111 may be formed of an oxide material. A portion of the interlayer insulation film 111 is etched using the photoresist pattern as an etch mask, and a metallic material is buried in the etched portion. As a result, metal lines M1 and M2 connected to the TSV 109 are formed. The metal lines M1 and M2 may be coupled not only to the TSV 109 but also to a bump (not shown) in a subsequent process to be connected to another semiconductor substrate.

Figure 2G:
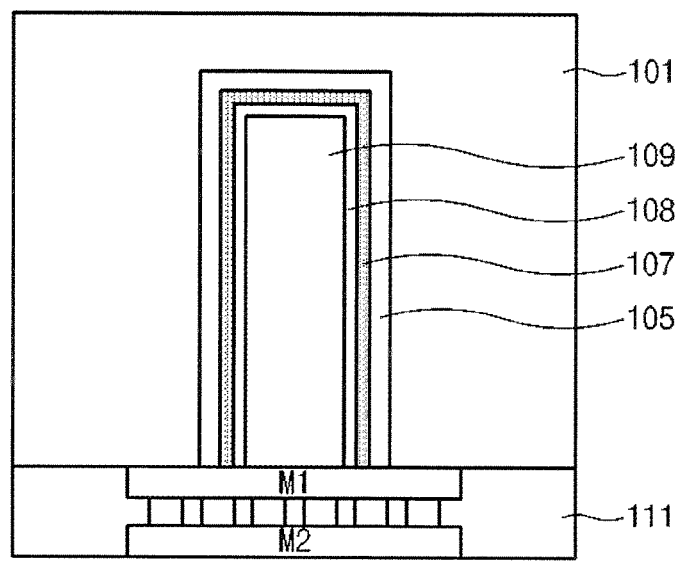

After that, the semiconductor substrate 101, over which the interlayer insulation film 111 and the metal lines M1 and M2 are formed, is turned over as shown in FIG. 2G, such that a back surface of the semiconductor substrate 101 faces upwards. After being turned over, the back side of the semiconductor substrate 101 is ground. In an embodiment, a carrier substrate (not shown) connected to the metal line M2 may be used when grinding the back side of the semiconductor substrate 101. In another embodiment, a carrier substrate (not shown) connected to a bump (not shown) may be used when grinding the back side of the semiconductor substrate 101. The carrier substrate may be used to support and fix the semiconductor substrate 101 when grinding the back side of the semiconductor substrate 101.

Figure 2H:
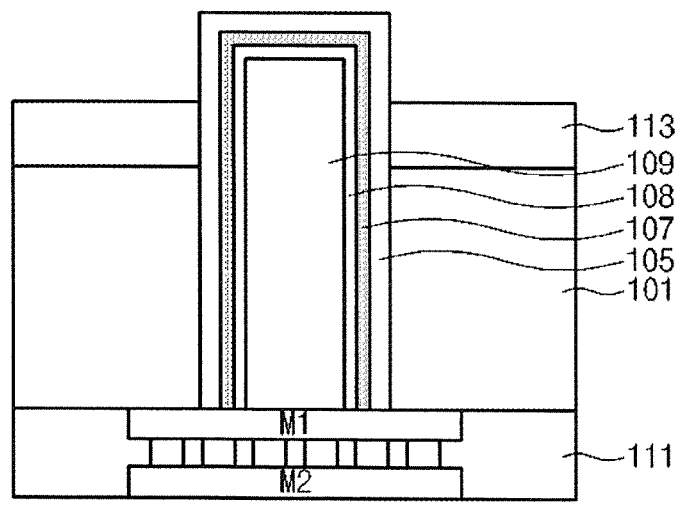

Referring to FIG. 2H, the ground back side of the semiconductor substrate 101 is etched so that the oxide film 105 enclosing the TSV 109 is partially exposed. In an embodiment, the semiconductor substrate 101 may be etched to remove a portion corresponding to a thickness of 4~8 μm as shown in FIG. 3, and thus a top surface and an upper portion of a sidewall of the oxide film 105 are exposed. Subsequently, a mask film 113 is formed over the etched semiconductor substrate 101. The mask film 113 may have a thickness of 3~3.5 μm as shown in FIG. 3. In an embodiment, the mask film 113 may be formed of a photoresist or carbon material. The TSV 109 passes through the mask film 113 and protrudes from a top surface of the mask film 113.

Figure 2I:
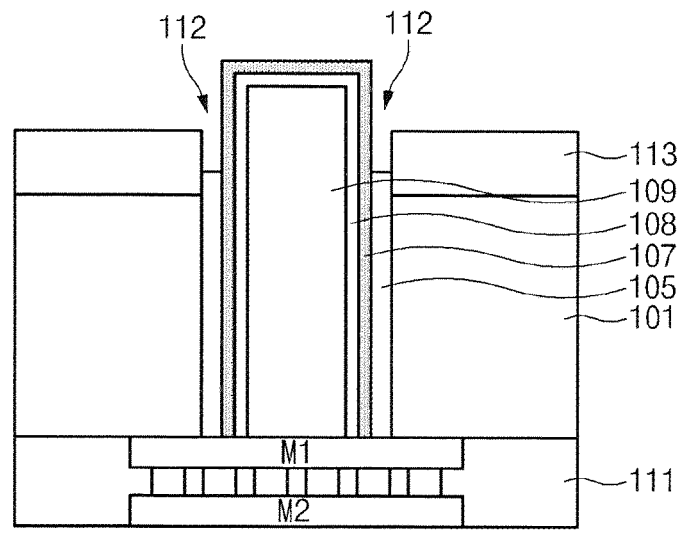

Referring to FIG. 2I, exposed portions of the oxide film 105 are etched using the mask film 113 as a mask. In an embodiment, a portion of the oxide film 105 disposed between the TSV 109 and the mask film 113 is also partially etched so that a hole 112 is formed between the TSV 109 and the mask film 113. In this case, the oxide film 105 still protrudes from the back surface of the semiconductor substrate 101, but does not protrude from the top surface of the mask film 113.

Figure 2J:
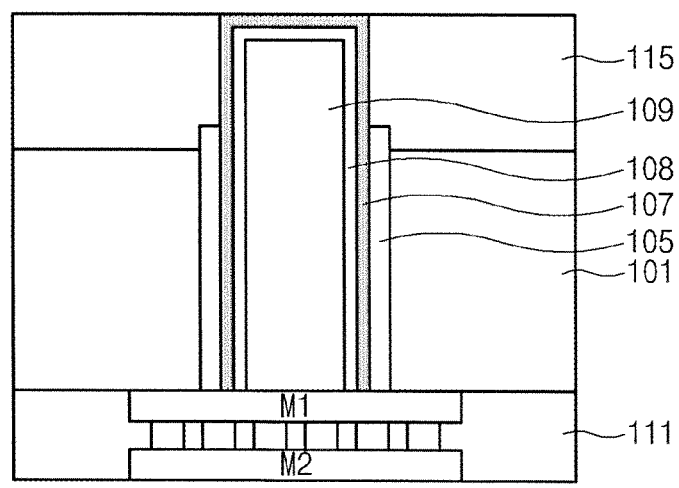

Referring to FIG. 2J, in an embodiment the mask film 113 is removed so that the back surface of the semiconductor substrate 101 is exposed. In this case, a top surface of the oxide film 105 remains higher than the back surface of the semiconductor substrate 101. The oxide film 105 may protrude from the back surface of the semiconductor 101 as much as 1~1.5 μm as shown in FIG. 3. Subsequently, an insulation film 115 is deposited over the back surface of the semiconductor substrate 101 so as to fill the hole 112. After that, the insulation film 115 is planarized so that a top surface of the prevention film 107 is exposed. The insulation film 115 may be formed of a nitride material.

If, contrary to the processes described above, the oxide film 105 is more deeply etched so that the top surface of the oxide film 105 is lower than the back surface of the semiconductor substrate 101, the insulation film 115 fills a space between the semiconductor substrate 101 and the TSV 109. However, in this case, since the insulation film 115 is formed in a wave shape around the space, a void may be generated between the semiconductor substrate 101 and the insulation film 115. This void affects the oxide film 105 located below the insulation film 115, and thus a crack may occur in the oxide film 105. As a result, copper (Cu) migration may occur through the crack. In order to solve this problem, in an embodiment, the oxide film 105 is formed so that the top surface is higher than the back surface of the semiconductor substrate 101.

As described above, according to embodiments of the present invention, an oxide film is formed to have a top surface protruding from the back surface of a semiconductor substrate by a predetermined height. As a result, formation of a void can be prevented in the process of forming the insulation film 115, and thus the occurrence of Cu migration can also be prevented.

As is apparent from the above description, a semiconductor device and a method for fabricating the same according to the present invention can prevent Cu migration from occurring when forming a through silicon via (TSV), and the generation of a bit-line contact crack is prevented. As a result, a production yield of the semiconductor device is improved.

Those skilled in the art will appreciate that embodiments may be carried out in other specific ways than those set forth herein without departing from the spirit and essential characteristics of the present invention. The above embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:
1. A method for forming a semiconductor device, the method comprising:
    forming a through silicon via (TSV) that is surrounded by
        an oxide film and passes through a semiconductor substrate, the semiconductor substrate including a circuit pattern formed at a front side of the semiconductor substrate;

exposing a top portion and an upper sidewall of the oxide film over the TSV by etching a portion of a back side of the semiconductor substrate;

forming a mask film over the etched semiconductor substrate;

etching the top portion and a part of the upper sidewall of the oxide film using the mask film as a mask;

removing the mask film so that a back surface of the etched semiconductor substrate is exposed and the etched oxide film protrudes from the back surface of the etched semiconductor substrate; and forming an insulation film over the etched semiconductor substrate and the etched oxide film.

2. The method according to claim 1, wherein forming the oxide film includes:

forming a vertical hole in the semiconductor substrate; and forming the oxide film along a surface of the vertical hole, wherein the TSV is formed by filling the vertical hole in which the oxide film is formed, with a conductive material.

3. The method according to claim 2, further comprising:

prior to filling the vertical hole with the conductive material, forming a prevention film along a surface of the oxide film; and forming a metal barrier film along a surface of the prevention film.

4. The method according to claim 3, wherein any of the insulation film and the prevention film includes a nitride film.

5. The method according to claim 1, wherein forming the mask film includes:

forming the mask film so that the TSV passes through the mask film and protrudes from a top surface of the mask film.

6. The method according to claim 1, wherein etching the top portion and the part of the upper sidewall of the oxide film includes:

etching the top portion and the part of the upper sidewall of the oxide film so that the etched oxide film protrudes from the back surface of the etched semiconductor substrate and includes a top surface disposed under a top surface of the mask film.

7. The method according to claim 1, wherein forming the insulation film over the back surface of the etched semiconductor substrate includes:

depositing an insulation material over the back surface of the etched semiconductor substrate, the etched oxide film, and the TSV; and planarizing the deposited insulation material until a top surface of the TSV is exposed to form the insulation film.

8. The method according to claim 1, wherein the mask film is formed of a photoresist or carbon material.

* * * * *